(12) United States Patent
Gu et al.

(10) Patent No.: US 11,209,507 B2
(45) Date of Patent: Dec. 28, 2021

(54) SWITCHING POWER SUPPLY AND MAGNETIC RESONANCE IMAGING SYSTEM

(71) Applicant: GE Precision Healthcare LLC, Wauwatosa, WI (US)

(72) Inventors: Hong Gu, BeiJing (CN); Zhenglin Yang, BeiJing (CN); Yanan Chen, BeiJing (CN); Haiyuan Sun, BeiJing (CN); Yang Chen, BeiJing (CN)

(73) Assignee: GE PRECISION HEALTHCARE LLC, Wauwatosa, WI (US)

( * ) Notice: Subject to any disclaimer, the term of this patent is extended or adjusted under 35 U.S.C. 154(b) by 110 days.

(21) Appl. No.: 16/716,704

(22) Filed: Dec. 17, 2019

(65) Prior Publication Data
US 2020/0200845 A1 Jun. 25, 2020

(30) Foreign Application Priority Data
Dec. 19, 2018 (CN) .......................... 201811553125.1

(51) Int. Cl.
*G01R 33/36* (2006.01)
(52) U.S. Cl.
CPC ................. *G01R 33/3607* (2013.01)
(58) Field of Classification Search
CPC ..................... G01R 33/36; G01R 33/3607
See application file for complete search history.

(56) References Cited

U.S. PATENT DOCUMENTS 5,023,566 A    6/1991  El-Hamamsy et al.
7,161,142 B1 * 1/2007  Patterson ............ H01J 49/0022
                                                  250/281
2002/0180440 A1* 12/2002 Heid ................... G01R 33/3614
                                                  324/318
2010/0118985 A1*  5/2010 Rozenboim .............. H04B 3/54
                                                  375/258
2011/0291657 A1* 12/2011 Davila ................... G01R 33/36
                                                  324/322
2012/0223709 A1*  9/2012 Schillak ............. G01R 33/3621
                                                  324/309

OTHER PUBLICATIONS

Marxgut et al., DC-DC Converter for Gate Power Supplies with an Optimal Air Transformer, Power Electronics and MV Drives, Mar. 2010, pp. 1865-1870, Turgi, Switzerland.
John Rice, Examining Wireless Power Transfer, Texas Instruments—2014/15 Power Supply Design Seminar.

* cited by examiner

*Primary Examiner* — Gregory H Curran
(74) *Attorney, Agent, or Firm* — Armstrong Teasdale LLP

(57) ABSTRACT

The present application provides a switching power supply and a magnetic resonance imaging system. The switching power supply is used for supplying power to a radio frequency coil control device, wherein the radio frequency coil control device is used for controlling a flow direction of radio frequency power output by a radio frequency amplifier of the magnetic resonance imaging system. Moreover, the switching power supply comprises a first power unit, a second power unit, and an air-cored transformer, the second power unit and the first power unit being electrically coupled through the air-cored transformer, wherein the switching power supply is configured to operate at a preset frequency, and frequency multiplication of the preset frequency is beyond a reception bandwidth of the magnetic resonance imaging system.

16 Claims, 4 Drawing Sheets

SWITCHING POWER SUPPLY AND MAGNETIC RESONANCE IMAGING SYSTEM

TECHNICAL FIELD

The present invention relates to a magnetic resonance imaging system, and in particular, to a switching power supply in a magnetic resonance imaging system.

BACKGROUND

Typically, a magnetic resonance imaging system includes a radio frequency coil assembly, a radio frequency amplifier, a radio frequency coil control device, and a switching power supply. The operating principle of the radio frequency coil control device is as follows: it can control an output flow direction of radio frequency power output by the radio frequency amplifier to control selection of a specific type of a radio frequency transmitting coil and/or a specific type of a radio frequency receiving coil. The switching power supply is connected to the radio frequency coil control device to supply power to the radio frequency coil control device. However, the switching power supply and the radio frequency coil control device are usually disposed in a scanning room having a strong magnetic field and the switching power supply is usually provided with a transformer. The problem is that if the transformer is magnetic, it cannot operate in an environment with a strong magnetic field.

In addition, although the switching power supply supplies power to the radio frequency coil control device with high efficiency, the switching power supply generates excess noise and, accordingly, produces large electromagnetic interference in the magnetic field, thus affecting the precision of a magnetic resonance image.

SUMMARY

The present invention provides a switching power supply and a magnetic resonance imaging system.

An exemplary embodiment of the present invention provides a switching power supply used for supplying power to a radio frequency coil control device, wherein the radio frequency coil control device is used for controlling a flow direction of radio frequency power output by a radio frequency amplifier of the magnetic resonance imaging system. Moreover, the switching power supply comprises a first power unit, a second power unit, and an air-cored transformer, the second power unit and the first power unit being electrically coupled through the air-cored transformer, wherein the switching power supply is configured to operate at a preset frequency, and frequency multiplication of the preset frequency is beyond a reception bandwidth of the magnetic resonance imaging system.

An exemplary embodiment of the present invention further provides a magnetic resonance imaging system comprising a radio frequency coil assembly, a radio frequency amplifier, a radio frequency coil control device, and a switching power supply, wherein the radio frequency coil assembly comprises a radio frequency transmitting coil and a radio frequency receiving coil; the radio frequency amplifier is used for outputting radio frequency power to excite the radio frequency coil assembly to generate a radio frequency signal; the radio frequency coil control device is used for controlling an output flow direction of the radio frequency power to control selection of a type of the radio frequency transmitting coil and/or a type of the radio frequency receiving coil; and the switching power supply is connected to the radio frequency coil control device and configured to supply power to the radio frequency coil control device, and the switching power supply comprises a first power unit, a second power unit, and an air-cored transformer, the second power unit and the first power unit being electrically coupled through the air-cored transformer, wherein the switching power supply is configured to operate at a preset frequency, and frequency multiplication of the preset frequency is beyond a reception bandwidth of the magnetic resonance imaging system.

Other features and aspects will become clear through the following detailed description, accompanying drawings, and claims.

BRIEF DESCRIPTION OF THE DRAWINGS

The present invention may be better understood by describing exemplary embodiments of the present invention with reference to accompanying drawings, in which.

DETAILED DESCRIPTION

Figure 1:
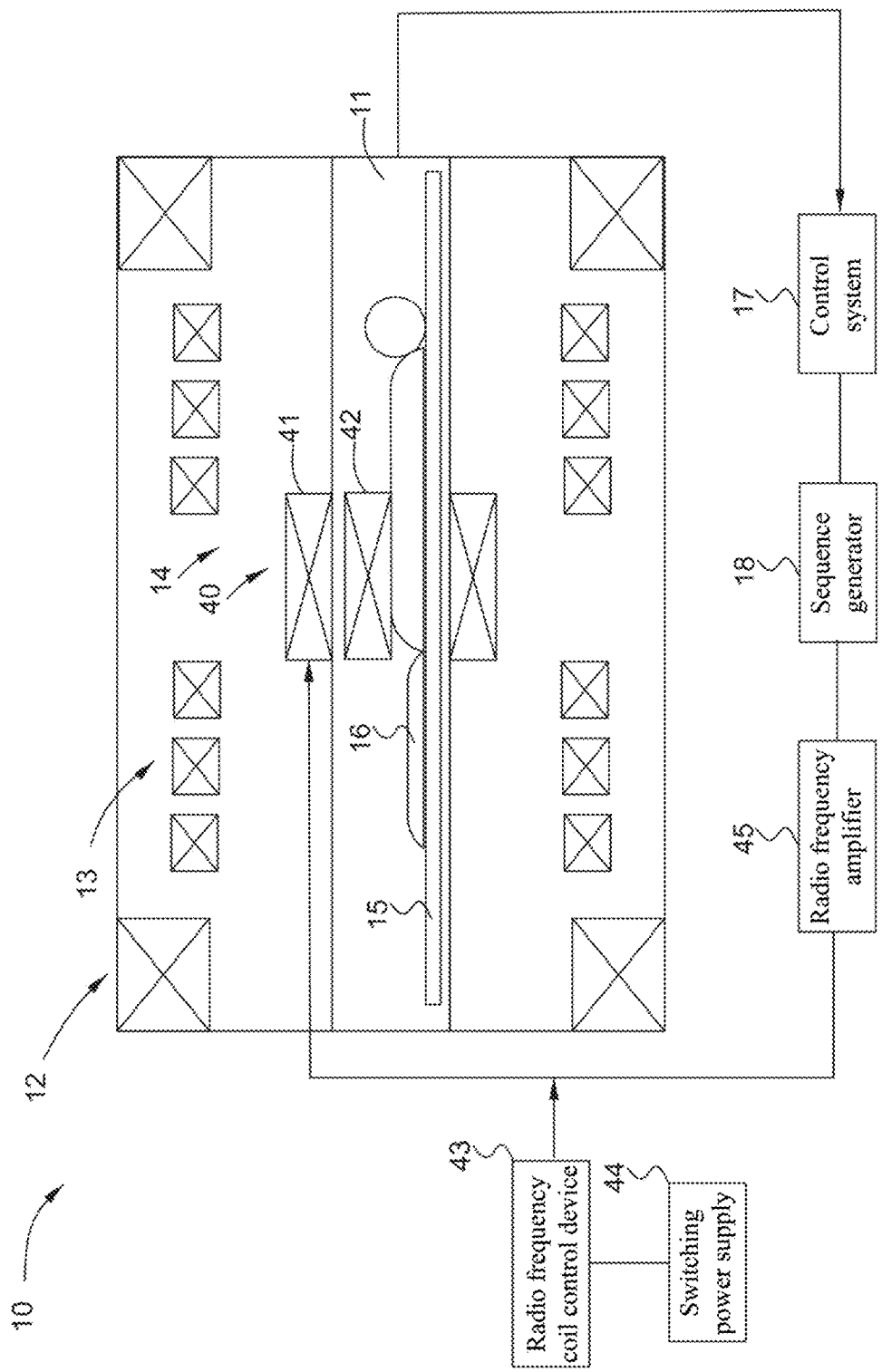
FIG. 1 is a schematic diagram of a magnetic resonance imaging system according to some embodiments of the present invention.

Specific implementation manners of the present invention will be described in the following detailed description. It should be noted that during the specific description of the implementation manners, it is impossible to describe all features of the actual implementation manners in detail in this description for the sake of brief description. It should be understood that in the actual implementation of any of the implementations, as in the process of any engineering or design project, a variety of specific decisions are often made in order to achieve the developer's specific objectives and meet system-related or business-related restrictions, which will vary from one implementation manner to another. Moreover, it can also be understood that although the efforts made in such development process may be complex and lengthy, for those of ordinary skill in the art related to content disclosed in the present invention, some changes in design, manufacturing, production or the like based on the technical content disclosed in this disclosure are only conventional technical means, and should not be construed that the content of this disclosure is insufficient.

Unless otherwise defined, technical terms or scientific terms used in the claims and the description should be construed in the ordinary meanings that can be understood by those of ordinary skill in the art of the present invention. The words "first," "second", and similar words used in the description and claims of the patent application of the present invention do not denote any order, quantity, or importance, but are merely used to distinguish different components. The word "one," "a/an", or a similar word does not denote a quantity limitation, but means that there is at least one. The word "include," "comprise" or a similar word is intended to mean that a component or an object that appears before "include" or "comprise" encompasses a component or an object and equivalent components that are listed after "include" or "comprise," and does not exclude other components or objects. The word "connect," "connected" or a similar word is not limited to a physical or mechanical connection, and is not limited to a direct or indirect connection.

In some embodiments, in a magnetic resonance imaging system (MRI), a switching power supply may be configured to supply power to a radio frequency coil control device used for controlling a flow direction of radio frequency power output by a radio frequency amplifier, so as to control selection of a specific type of a radio frequency transmitting coil and/or a specific type of a radio frequency receiving coil. It should be noted that from the perspective of those of ordinary skill in the art or related art, such description should not be construed as limiting the present invention only to supplying power to a radio frequency coil control device or being in a magnetic resonance imaging system. In fact, the switching power supply described here may be reasonably applied to other relevant fields such as communications, medical treatment, and welding.

FIG. 1 is a block diagram of a magnetic resonance imaging system according to an embodiment of the present invention. As shown in FIG. 1, the magnetic resonance imaging system 10 includes a main magnet 12, a gradient system 13, a radio frequency system 14, and a control system 17. A scanning chamber 11 is formed in the hollow part of the main magnet 12. A load bed 15 used for loading a detected object 16 (for example, a human body) can enter the scanning chamber 11 for magnetic resonance imaging of the detected object 16. A static magnetic field $B_0$ generated by the main magnet 12 causes the detected object 16 in the scanning chamber 11 to generate a longitudinal macroscopic magnetization vector.

The gradient system 13 includes gradient coils and gradient controllers (not shown) respectively arranged in different directions (for example, up and down, left and right, and front and back directions of the human body, corresponding to the Z axis, X axis, and Y axis with coordinates reconstructed). The gradient controllers are used for transmitting gradient pulses to the gradient coils to linearly superimpose a gradient field on the static magnetic field to spatially locate magnetic resonance signals, thereby generating a magnetic resonance image of any level or volume.

The radio frequency system 14 includes a radio frequency coil assembly 40, a radio frequency amplifier 45, a radio frequency coil control device 43, and a switching power supply 44. The radio frequency coil assembly 40 may include a radio frequency transmitting coil 41 and a radio frequency receiving coil 42. The radio frequency transmitting coil 41 includes a body coil, a head coil, and so on. The radio frequency receiving coil 42 includes a body coil, a head coil, a surface coil, and so on.

The radio frequency amplifier 45 is used for outputting radio frequency power to excite the radio frequency coil assembly 40 to generate a radio frequency signal. For example, radio frequency excitation pulses may be transmitted to the radio frequency transmitting coil 41 to excite the longitudinal magnetization vector of the detected object to flip over so as to generate a horizontal magnetization vector. After the radio frequency excitation pulses end, the horizontal magnetization vector spirally decays about an external magnetic field at a fixed angular frequency to generate a free induction decay signal. The radio frequency receiving coil 42 may collect and analyze free induction decay signals to generate magnetic resonance signals for imaging the detected object.

The radio frequency coil control device 43 may be used for controlling an output flow direction of the radio frequency power to control selection of a specific type of the radio frequency transmitting coil 41 and/or a specific type of the radio frequency receiving coil 42. The switching power supply 44 is connected to the radio frequency coil control device 43 and configured to supply power to the radio frequency coil control device 43. In some embodiments, the radio frequency coil control device 43 may control selection of one of the body coil and the head coil as the radio frequency transmitting coil. The selected coil may also serve as the radio frequency receiving coil. In some embodiments, the radio frequency coil control device 43 may control selection of one of the body coil and the head coil as the radio frequency transmitting coil, and cannot control selection of the specific type of the radio frequency receiving coil. In some embodiments, the radio frequency coil control device 43 includes a switch. When the switch is turned on, the radio frequency power flows to the body coil to control the body coil to operate. When the switch is turned off, the radio frequency power flows to the head coil to control the head coil to operate. In some embodiments, the radio frequency transmitting coil is not limited to the body coil and head coil mentioned in the present application, and may also include other various appropriate coil types. The radio frequency receiving coil is also not limited to the body coil, head coil, and surface coil mentioned in the present application, and may also include other various appropriate coil types.

On the one hand, the control system 17 is used for generating a pulse control sequence. The pulse control sequence is sent to the radio frequency amplifier 45, the gradient controller, and so on by a sequence generator 18, so that the radio frequency amplifier 45, the gradient controller, and so on respectively execute a radio frequency timing sequence and a gradient timing sequence in the pulse control sequence, and collect magnetic resonance signals in a specific time period of the timing sequence. On the other hand, the control system 17 is used for performing image reconstruction based on the collected magnetic resonance signals.

Figure 2:
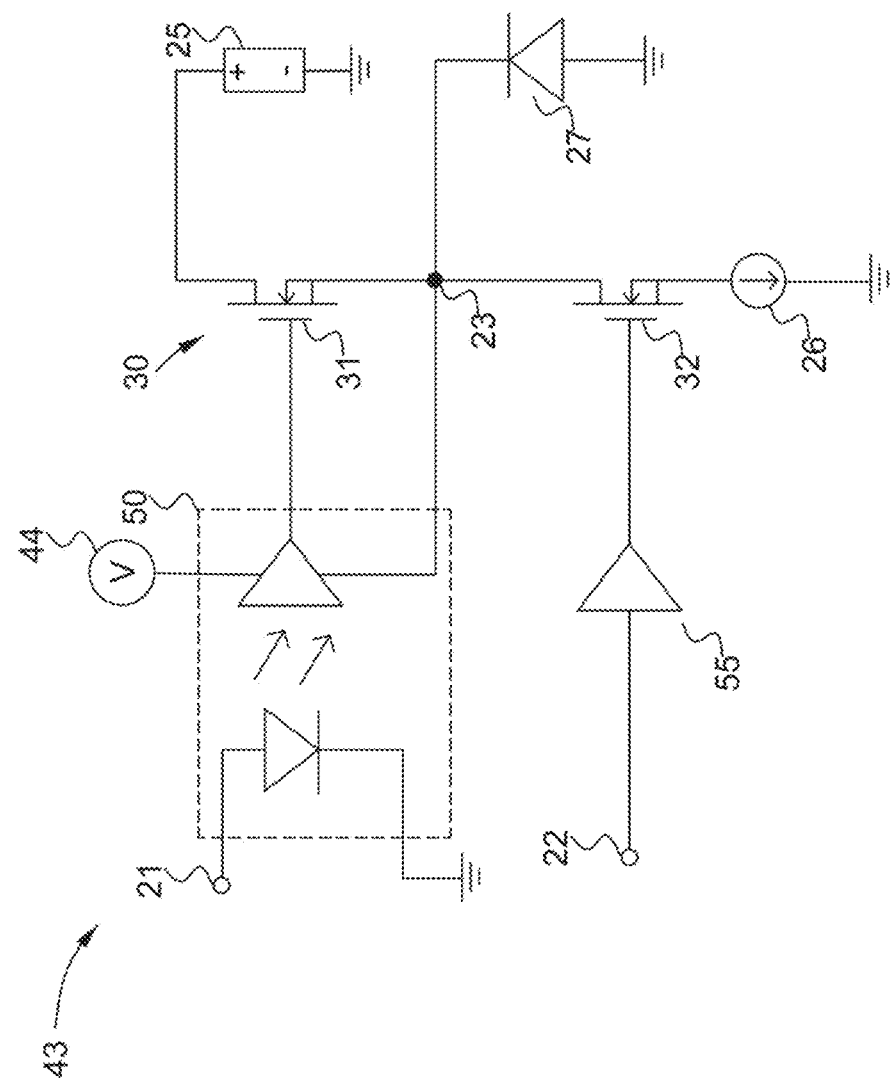
FIG. 2 is a schematic diagram of a radio frequency coil control device in the magnetic resonance imaging system shown according to FIG. 1.

FIG. 2 is a schematic diagram of the radio frequency coil control device 43 in the magnetic resonance imaging system 10 shown in FIG. 1. As shown in FIG. 2, the radio frequency coil control device 43 includes a control switch 27, a half-bridge circuit 30, and a voltage conversion device 50.

In some embodiments, the voltage conversion device 50 is configured to receive a first driving signal through a terminal 21 and may convert the first driving signal into a first control signal. In some embodiments, a first end of the voltage conversion device 50 is connected to the switching power supply 44. In some embodiments, the voltage conversion device 50 includes a photoelectric coupler.

In some embodiments, the radio frequency coil control device 43 further includes a buffer unit 55. The buffer unit 55 is configured to receive a second driving signal through a terminal 22 and may buffer the second driving signal to generate a second control signal.

In some embodiments, the half-bridge circuit 30 includes a first switch 31 and a second switch 32 connected in series. A driving end (namely, a gate) of the first switch 31 is connected to a second end of the voltage conversion device 50 to receive the first control signal; a drain of the first switch 31 is connected to a high-voltage power supply 25; a source of the first switch 31 is connected to a drain of the second switch 32 and a third end of the voltage conversion device 50; and a driving end (namely, a gate) of the second switch 32 is connected to the buffer unit 55 to receive the second control signal. A source of the second switch 32 is connected to a constant current source 26. In some embodiments, the first switch 31 and the second switch 32 may be any suitable solid-state semiconductor switching components, for example, insulated gate bipolar transistors (Insulated Gate Bipolar Transistor, IGBTs) and metal oxide semiconductor field effect transistors (Metal Oxide Semi-Conductor Field Effect Transistors, MOSFETs).

In some embodiments, the control switch 27 is connected to a connection point 23 between the first switch 31 and the second switch 32 and configured to control the output flow direction of the radio frequency power based on the on and off of the first switch 31 and the second switch 32. In some non-limiting embodiments, the control switch 27 may be a diode. When the first switch 31 is turned on and the second switch 32 is turned off, the control switch 27 is reversely cut off, and no current flows through the control switch 27. When the first switch 31 is turned off and the second switch 32 is turned on, a current flows toward the second switch 32 and the current source 26 through the control switch 27, that is, the control switch 27 is turned on. In some embodiments, other non-limiting examples of the control switch 27 include a transistor, a gate commutated thyristor, a field effect transistor, an insulated gate bipolar transistor (IGBT), a gate turn-off thyristor, a static induction transistor, a static induction thyristor, or a combination thereof.

In some embodiments, the on and off of the first switch 31 and the second switch 32 may be controlled by controlling the first driving signal and the second driving signal. For example, when the first driving signal is at high level and the second driving signal is at low level, the first switch 31 is turned on and the second switch 32 is turned off; when the first driving signal is at low level and the second driving signal is at high level, the first switch 31 is turned off and the second switch 32 is turned on. In some embodiments, the first switch 31 or the second switch 32 can be turned on only when a gate voltage of the first switch 31 or the second switch 32 is 15 V higher than a source voltage. As a result, the first driving signal and the second driving signal are usually of 15 V. However, since the voltage at the source of the second switch 31 (namely, the connection point 23) floats, the gate voltage of the first switch 31 is not necessarily 15 V higher than the source voltage, and thus the first switch 31 is not necessarily turned on. Accordingly, a switching power supply needs to be provided to supply power to the switching device 50 so that the voltage output by the switching device 50 (namely, the voltage between the second end and the third end) is equal to the voltage (for example, 15 V) provided by the switching power supply 44.

Figure 3:
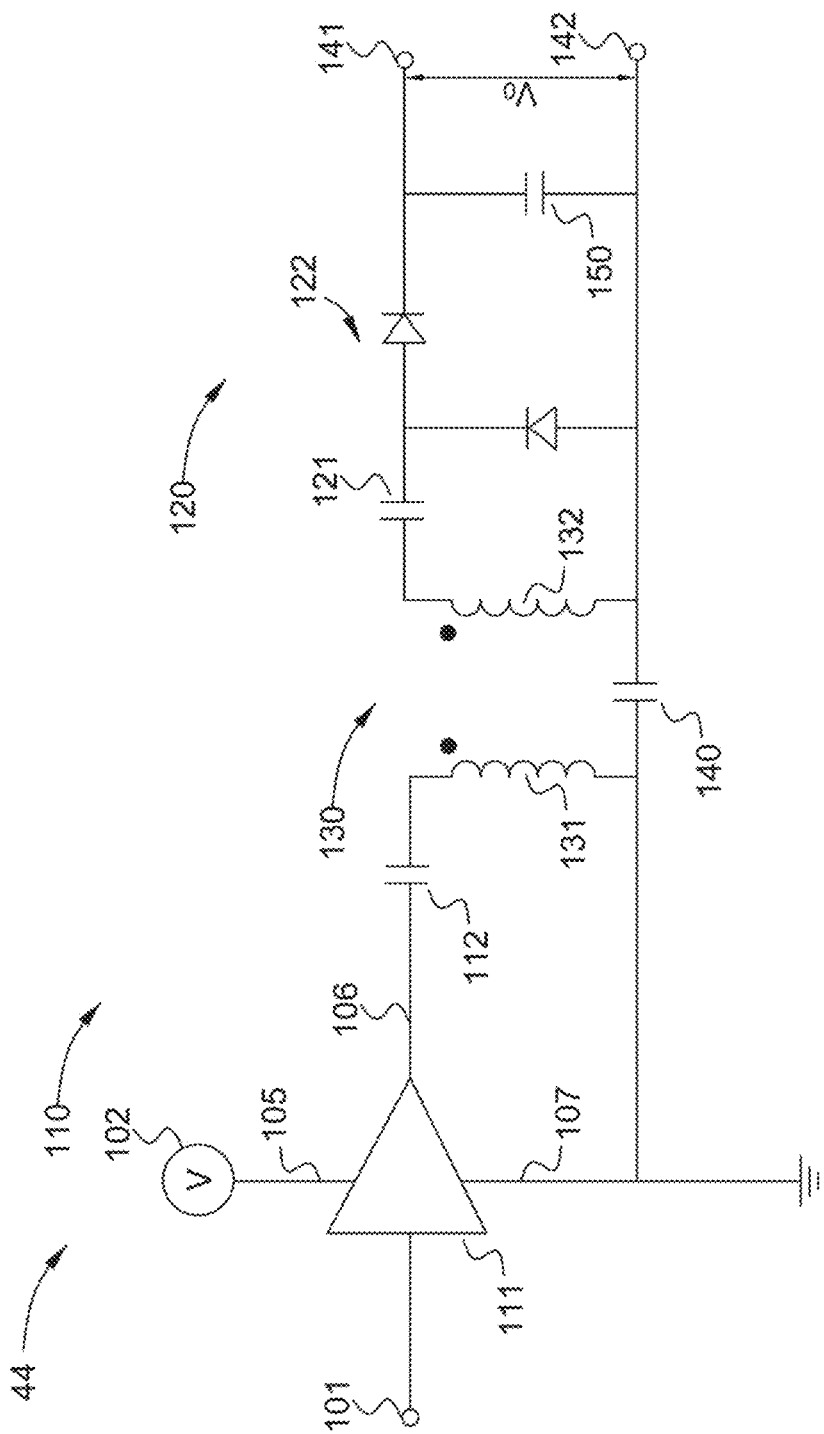
FIG. 3 is a schematic diagram of a switching power supply in the magnetic resonance imaging system shown according to FIG. 1.
Figure 4:
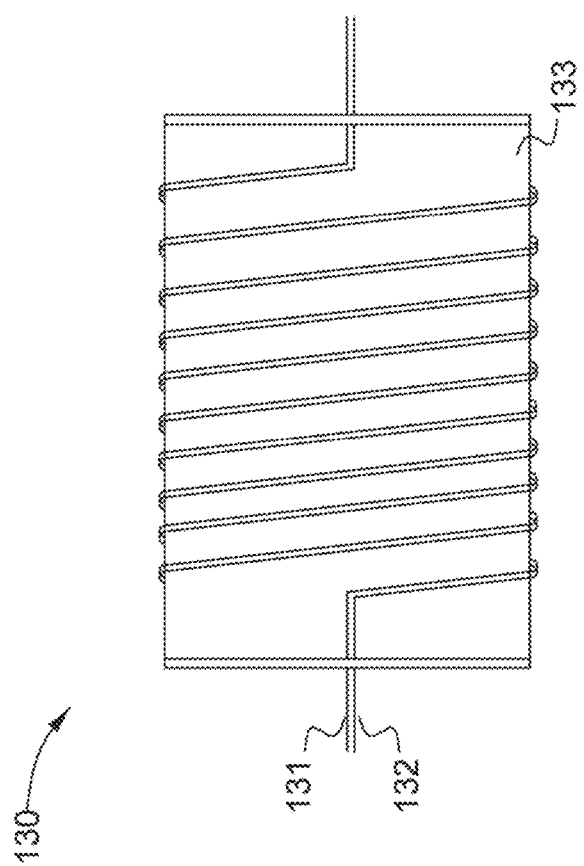
FIG. 4 is a schematic diagram of a transformer in the switching power supply shown according to FIG. 3.

FIG. 3 is a schematic diagram of the switching power supply 44 in the magnetic resonance imaging system 10 shown in FIG. 1. FIG. 4 is a schematic diagram of an air-cored transformer 130 in the switching power supply 44 shown in FIG. 3. As shown in FIG. 3, the switching power supply 44 includes a first power unit 110, a second power unit 120, and the air-cored transformer 130, the second power unit 120 and the first power unit 110 being electrically coupled through the air-cored transformer 130, where the switching power supply 44 is configured to operate at a preset frequency, and frequency multiplication of the preset frequency is beyond a reception bandwidth of the magnetic resonance imaging system. In some embodiments, the preset frequency is 1.4 MHz.

In some embodiments, the switching power supply 44 is set to operate at the preset frequency so that the noise of the switching power supply can be beyond the reception bandwidth of the magnetic resonance imaging system. That is, the noise generated by the switching power supply cannot be received by the magnetic resonance imaging system, and thus does not interfere with the final magnetic resonance image.

In some embodiments, the air-cored transformer 130 includes a non-magnetic core, a first winding 131, and a second winding 132 magnetically coupled to the first winding. Further, as shown in FIG. 4, the first winding 131 and the second winding 132 are wound on the non-magnetic core 133 side by side. In some embodiments, the first winding 131 and the second winding 132 are tightly wound together to increase the coupling coefficient of the air-cored transformer 130.

In some embodiments, the first power unit 110 includes a power amplifier 111 and a first capacitor 112. In some embodiments, the power amplifier 111 is configured to perform power amplification on an input signal; an input end 101 of the power amplifier 111 is used for receiving the input signal; a first end 105 of the power amplifier 111 is connected to a power supply 102; and the first capacitor 112 and the first winding 131 of the air-cored transformer 130 are connected in series between a second end 106 and a third end 107 of the power amplifier 111. In some embodiments, the input signal is a synchronous clock signal, and the input signal operates at the preset frequency, for example, 1.4 MHz. In some embodiments, the first capacitor 112 is configured to filter out a direct current component in the amplified signal output by the power amplifier 111 so as to output a first signal to the first winding 131.

In some embodiments, the second power unit 120 includes a second capacitor 121 and a rectifying unit 122. In some embodiments, the second capacitor 121 is connected to the second winding 132 of the air-cored transformer 130 and configured to filter out a direct current component in a second signal output by the second winding 132. In some embodiments, the rectifying unit 122 is connected to the second capacitor 121 and configured to convert an alternating current component in the second signal into a direct current output signal. In some embodiments, the rectifying unit 122 is formed by diode components.

In some embodiments, the second power unit 120 further includes an output capacitor 150 connected in parallel to a rectifier 122 and having a low-pass filter function to filter out fluctuation signals in a direct current voltage generated by the rectifier 122. It can be understood that in other embodiments, the output capacitor 150 may also be omitted in the second power unit 120 in specific implementation.

In some embodiments, the second power unit 120 may output the adjusted direct current voltage ($V_o$) through two output ports 141 and 142 to apply it to the radio frequency coil control device. In some embodiments, the direct current voltage ($V_o$) is provided to the first end of the voltage conversion device 50 (as shown in FIG. 2).

In some embodiments, the switching power supply 44 further includes a bypass unit 140, where the bypass unit 140 is connected between the first winding 131 and the second winding 132, and the bypass unit 140 is configured to bypass the interference of a common mode current caused by tight arrangement of the first winding 131 and the second winding 132. In some embodiments, the bypass unit 140 includes a bypass capacitor.

On the one hand, the switching power supply provided in the present application uses an air-cored transformer, so as to solve the problem where a conventional magnetic core cannot operate in an environment with a strong magnetic field and an efficient isolated voltage source can be provided to the radio frequency coil control device; on the other hand, the switching power supply is set to operate at a preset frequency so that frequency multiplication of the preset frequency is beyond the reception bandwidth of the magnetic resonance imaging system, so as to avoid interference with the precision of a magnetic resonance image caused by noise generated by the switching power supply.

Some exemplary embodiments have been described above; however, it should be understood that various modifications may be made. For example, if the described techniques are performed in a different order and/or if the components of the described system, architecture, device, or circuit are combined in other manners and/or replaced or supplemented with additional components or equivalents thereof, a suitable result can be achieved. Accordingly, other implementation manners also fall within the protection scope of the claims.

The invention claimed is:

1. A switching power supply, for supplying power to a radio frequency coil control device, wherein the radio frequency coil control device is used for controlling a flow direction of radio frequency power output by a radio frequency amplifier of a magnetic resonance imaging system, the switching power supply comprising:
   a first power unit and a second power unit; and
   an air-cored transformer, the second power unit and the first power unit being electrically coupled through the air-cored transformer, wherein
   the switching power supply is configured to supply direct current power to the radio frequency coil control device and operate at a preset frequency, and frequency multiplication of the preset frequency is beyond a reception bandwidth of the magnetic resonance imaging system.

2. The switching power supply according to claim 1, wherein the air-cored transformer comprises a non-magnetic core, a first winding, and a second winding magnetically coupled to the first winding, and the first winding and the second winding are wound on the non-magnetic core side by side.

3. The switching power supply according to claim 2, further comprising a bypass unit, wherein the bypass unit is connected between the first winding and the second winding.

4. The switching power supply according to claim 2, wherein the first power unit comprises:
   a power amplifier, for performing power amplification on an input signal; and
   a first capacitor, connected to the power amplifier and used for filtering out a direct current component in the amplified signal to output a first signal to the first winding.

5. The switching power supply according to claim 4, wherein the input signal operates at the preset frequency.

6. The switching power supply according to claim 4, wherein the second power unit comprises:
   a second capacitor, connected to the second winding and used for filtering out a direct current component in a second signal output by the second winding; and
   a rectifying unit, connected to the second capacitor and used for converting an alternating current component in the second signal into a direct current output signal.

7. The switching power supply according to claim 1, wherein the preset frequency is 1.4 MHz.

8. A magnetic resonance imaging system, comprising:
   a radio frequency coil assembly, comprising a radio frequency transmitting coil and a radio frequency receiving coil;
   a radio frequency amplifier, for outputting radio frequency power to excite the radio frequency coil assembly to generate a radio frequency signal;
   a radio frequency coil control device, for controlling an output flow direction of the radio frequency power to control selection of at least one of a specific type of the radio frequency transmitting coil and a specific type of the radio frequency receiving coil; and
   a switching power supply configured to supply power to the radio frequency coil control device, wherein the switching power supply further comprises:
   (i) a first power unit and a second power unit; and
   (ii) an air-cored transformer, the second power unit and the first power unit being electrically coupled through the air-cored transformer,
      wherein the switching power supply is configured to supply direct current power to the radio frequency coil control device and operate at a preset frequency, and
   frequency multiplication of the preset frequency is beyond a reception bandwidth of the magnetic resonance imaging system.

9. The magnetic resonance imaging system according to claim 8, wherein the radio frequency coil control device comprises:
   a control switch, configured to control the output flow direction of the radio frequency power;
   a half-bridge circuit, comprising a first switch and a second switch connected in series, wherein a connection point of the first switch and the second switch is connected to the control switch; and
   a voltage conversion device, connected to a driving end of the first switch and the switching power supply, and configured to convert a first driving signal into a first control signal to control the first switch.

10. The magnetic resonance imaging system according to claim 9, wherein the radio frequency coil control device further comprises a buffer unit that is connected to a driving end of the second switch, and configured to buffer a second driving signal to control the second switch.

11. The magnetic resonance imaging system according to claim 8, wherein the air-cored transformer comprises a non-magnetic core, a first winding, and a second winding magnetically coupled to the first winding, and the first winding and the second winding are wound on the non-magnetic core side by side.

12. The magnetic resonance imaging system according to claim 11, wherein the switching power supply further comprises a bypass unit, wherein the bypass unit is connected between the first winding and the second winding.

13. The magnetic resonance imaging system according to claim 11, wherein the first power unit comprises:
   a power amplifier, for performing power amplification on an input signal; and
   a first capacitor, connected to the power amplifier and used for filtering out a direct current component in the amplified signal to output a first signal to the first winding.

14. The magnetic resonance imaging system according to claim 13, wherein the input signal operates at the preset frequency.

15. The magnetic resonance imaging system according to claim 13, wherein the second power unit comprises:
- a second capacitor, connected to the second winding and used for filtering out a direct current component in a second signal output by the second winding; and
- a rectifying unit, connected to the second capacitor and used for converting an alternating current component in the second signal into a direct current output signal.

16. The magnetic resonance imaging system according to claim 8, wherein the preset frequency is 1.4 MHz.

\* \* \* \* \*